(12) United States Patent
Matsumoto et al.

(10) Patent No.: US 10,778,185 B2
(45) Date of Patent: Sep. 15, 2020

(54) COMPOSITE ELECTRONIC COMPONENT

(71) Applicant: Murata Manufacturing Co., Ltd., Nagaokakyo-shi, Kyoto-fu (JP)

(72) Inventors: Katsuya Matsumoto, Nagaokakyo (JP); Yasuyuki Ida, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/212,801

(22) Filed: Dec. 7, 2018

(65) Prior Publication Data
US 2019/0199324 A1 Jun. 27, 2019

(30) Foreign Application Priority Data

Dec. 25, 2017 (JP) ................. 2017-248386

(51) Int. Cl.
| | |
|---|---|
| *H03H 9/70* | (2006.01) |
| *H03H 9/54* | (2006.01) |
| *H03H 9/205* | (2006.01) |
| *H03H 9/05* | (2006.01) |
| *H03H 9/13* | (2006.01) |
| *H03H 9/10* | (2006.01) |
| *H01L 41/187* | (2006.01) |

(52) U.S. Cl.
CPC .............. *H03H 9/545* (2013.01); *H03H 9/05* (2013.01); *H03H 9/0547* (2013.01); *H03H 9/1064* (2013.01); *H03H 9/13* (2013.01); *H03H 9/205* (2013.01); *H03H 9/70* (2013.01); *H01L 41/1873* (2013.01)

(58) Field of Classification Search
CPC ........ H03H 9/545; H03H 9/05; H03H 9/1064; H03H 9/13; H03H 9/205; H03H 9/70; H01L 41/1873
See application file for complete search history.

(56) References Cited

U.S. PATENT DOCUMENTS

| 7,511,595 B2 * | 3/2009 | Park ..................... H03H 3/04 29/25.35 |
| 8,294,535 B2 * | 10/2012 | Feiertag ............. H03H 9/059 333/187 |
| 9,634,641 B2 * | 4/2017 | Nishimura .......... H03H 9/059 |
| 2007/0115079 A1 | 5/2007 | Kubo et al. |

(Continued)

FOREIGN PATENT DOCUMENTS

| JP | 2015-91065 A | 5/2015 |
| WO | 2006/008940 A1 | 1/2006 |

(Continued)

*Primary Examiner* — Fernando L Toledo
*Assistant Examiner* — Valerie N Newton
(74) *Attorney, Agent, or Firm* — Keating & Bennett, LLP

(57) ABSTRACT

A composite electronic component includes a first acoustic wave filter, a second acoustic wave filter, a spacer layer, and a switch. The second acoustic wave filter faces the first acoustic wave filter in a first direction. The switch switches an ON state and an OFF state of the first acoustic wave filter and an ON state and an OFF state of the second acoustic wave filter. A first functional electrode and a second functional electrode are located in a hollow space and face each other in the first direction. The switch brings at least one of the first acoustic wave filter and the second acoustic wave filter into the OFF state.

16 Claims, 6 Drawing Sheets

(56) References Cited

U.S. PATENT DOCUMENTS

2015/0295596 A1* 10/2015 Wloczysiak ............ H03F 1/565
                                                                     370/297
2016/0301382 A1* 10/2016 Iwamoto ................ H04B 1/006
2018/0269849 A1    9/2018 Matsumoto et al.

FOREIGN PATENT DOCUMENTS

| WO | 2015/098793 A1 | 7/2015 |
| WO | 2017/110308 A1 | 6/2017 |

* cited by examiner

COMPOSITE ELECTRONIC COMPONENT

CROSS REFERENCE TO RELATED APPLICATIONS

This application claims the benefit of priority to Japanese Patent Application No. 2017-248386 filed on Dec. 25, 2017. The entire contents of this application are hereby incorporated herein by reference.

BACKGROUND OF THE INVENTION

1. Field of the Invention

The present invention relates to a composite electronic component, and more particularly, to a composite electronic component including a plurality of acoustic wave filters.

2. Description of the Related Art

There has been known a structure including two acoustic wave devices (see, for example, International Publication No. 2017/110308).

In the structure described in International Publication No. 2017/110308, one acoustic wave device is arranged above the other acoustic wave device. The one acoustic wave device is inverted with respect to the other acoustic wave device. In the structure described in International Publication No. 2017/110308, the principal surfaces of the two acoustic wave devices in which interdigital transducer (IDT) electrodes are provided face each other with a hollow space interposed therebetween.

In the composite electronic component having the structure described in International Publication No. 2017/110308, when the two acoustic wave devices are used as acoustic wave filters and when the two acoustic wave filters are turned ON simultaneously, a problem arises in that the acoustic wave filters may interfere with each other. That is, when the two acoustic wave filters are brought into a state in which signals are able to pass through both of the acoustic wave filters, noise propagates from one of the two acoustic wave filters to the other. The description "the acoustic wave filter is turned ON" refers to a state in which a signal is able to pass through the acoustic wave filter.

SUMMARY OF THE INVENTION

Preferred embodiments of the present invention provide composite electronic components in each of which interference between acoustic wave filters is able to be reduced or prevented.

According to a preferred embodiment of the present invention, a composite electronic component includes a first acoustic wave filter, a second acoustic wave filter, a spacer layer, and a switch. The second acoustic wave filter faces the first acoustic wave filter in a first direction. The spacer layer has a substantially frame shape and is provided between the first acoustic wave filter and the second acoustic wave filter in the first direction. The switch switches an ON state and an OFF state of the first acoustic wave filter and an ON state and an OFF state of the second acoustic wave filter. The first acoustic wave filter includes a first support member and a first functional electrode. The first support member has piezoelectricity at least in a portion thereof. The first functional electrode is provided at a first principal surface of the first support member. The second acoustic wave filter includes a second support member and a second functional electrode. The second support member has piezoelectricity at least in a portion thereof. The second functional electrode is provided at a second principal surface of the second support member. A hollow space is defined by the first support member, the second support member, and the spacer layer. The first functional electrode and the second functional electrode are located in the hollow space and face each other in the first direction. The switch brings at least one of the first acoustic wave filter and the second acoustic wave filter into the OFF state.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Composite electronic components according to preferred embodiments are described below with reference to the drawings.

FIGS. 1A and 1B, FIGS. 3A and 3B, and FIGS. 6A and 6B illustrating preferred embodiments are schematic diagrams or views and the ratios of sizes and thicknesses of elements in the figures do not essentially reflect actual dimensional ratios.

First Preferred Embodiment

First, the overall structure of a composite electronic component according to a first preferred embodiment of the present invention is described with reference to the drawings.

Figure 1A:
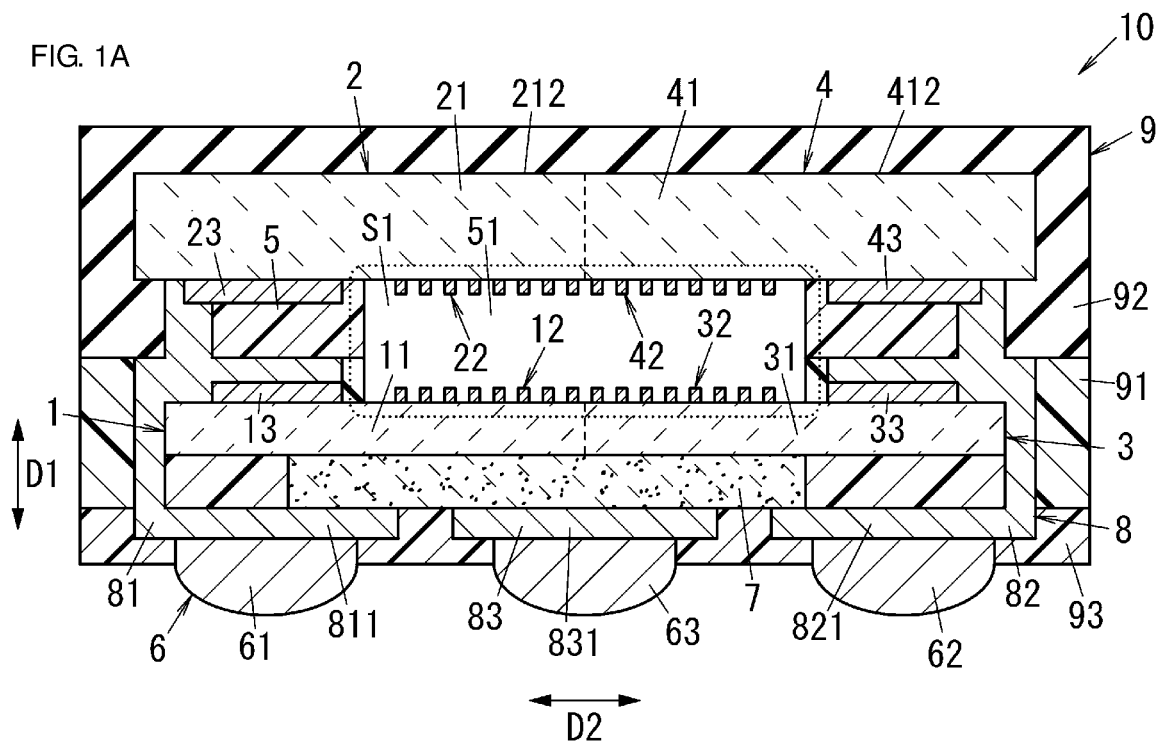
FIG. 1A is a cross-sectional view of a composite electronic component according to a first preferred embodiment of the present invention.
Figure 1B:
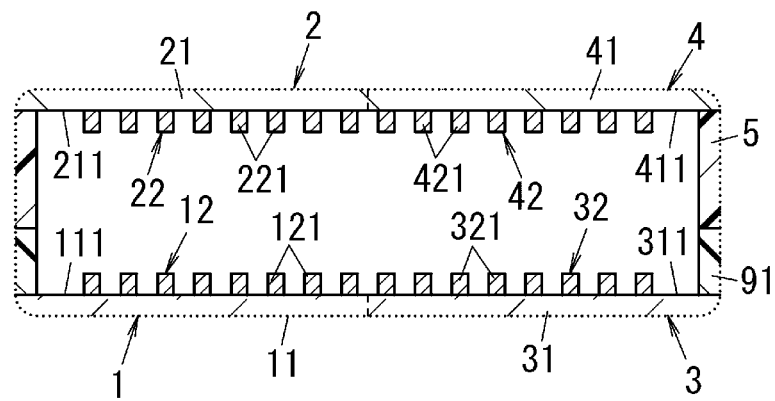
FIG. 1B is a cross-sectional view of a main portion of the composite electronic component.

As illustrated in FIGS. 1A and 1B, a composite electronic component 10 according to the first preferred embodiment includes a first acoustic wave filter 1, a second acoustic wave filter 2, a third acoustic wave filter 3, a fourth acoustic wave filter 4, a spacer layer 5, a plurality of (three in the illustrated example) external connection electrodes 6, a switch 7, a plurality of (three in the illustrated example) wiring members 8, and a resin member 9.

Next, elements of the composite electronic component 10 according to the first preferred embodiment are described with reference to the drawings.

The first acoustic wave filter 1 includes a first piezoelectric substrate 11 (first support member) and a first interdigital transducer (IDT) electrode 12 (first functional electrode).

The first piezoelectric substrate 11 supports the first IDT electrode 12. The first piezoelectric substrate 11 is a substrate made of a piezoelectric material. As the piezoelectric material for the first piezoelectric substrate 11, a piezoelectric material, such as $LiTaO_3$, $LiNbO_3$, or quartz crystal, for example, is preferably used as appropriate.

The first IDT electrode 12 faces a first principal surface 111 of the first piezoelectric substrate 11 in a first direction D1 that is a thickness direction of the first piezoelectric substrate 11. In the example of FIG. 1A, the first IDT electrode 12 is provided on the first principal surface 111 of the first piezoelectric substrate 11. The description "an n-th (n is a natural number) IDT electrode faces the principal surface of an n-th piezoelectric substrate" encompasses a case in which the n-th IDT electrode faces the principal surface of the n-th piezoelectric substrate while being spaced away from the principal surface and a case in which the n-th IDT electrode is provided on the principal surface of the n-th piezoelectric substrate. The case in which the n-th IDT electrode faces the principal surface of the n-th piezoelectric substrate while being spaced away from the principal surface encompasses, for example, a case in which an oxide film is provided on the principal surface of the n-th piezoelectric substrate and the n-th IDT electrode is provided on the oxide film.

The first IDT electrode 12 includes a plurality of electrode fingers 121 and two busbars (not illustrated). The plurality of electrode fingers 121 are disposed side by side in a second direction D2 orthogonal or substantially orthogonal to the first direction D1 that is the thickness direction of the first piezoelectric substrate 11. The two busbars have a substantially elongated shape with the second direction D2 as its longitudinal direction and are electrically connected to the plurality of electrode fingers 121.

The second acoustic wave filter 2 includes a second piezoelectric substrate 21 (second support member) and a second IDT electrode 22 (second functional electrode).

The second piezoelectric substrate 21 supports the second IDT electrode 22. The second piezoelectric substrate 21 is a substrate made of a piezoelectric material. As the piezoelectric material for the second piezoelectric substrate 21, a piezoelectric material, such as $LiTaO_3$, $LiNbO_3$, or quartz crystal, for example, is preferably used as appropriate.

The second IDT electrode 22 faces a second principal surface 211 of the second piezoelectric substrate 21 in the first direction D1 that is a thickness direction of the second piezoelectric substrate 21. In the example of FIG. 1A, the second IDT electrode 22 is provided on the second principal surface 211 of the second piezoelectric substrate 21.

The second IDT electrode 22 includes a plurality of electrode fingers 221 and two busbars (not illustrated). The plurality of electrode fingers 221 are disposed side by side in the second direction D2. The two busbars have a substantially elongated shape with the second direction D2 as its longitudinal direction and are electrically connected to the plurality of electrode fingers 221.

The third acoustic wave filter 3 includes a third piezoelectric substrate 31 (third support member) and a third IDT electrode 32 (third functional electrode).

The third piezoelectric substrate 31 supports the third IDT electrode 32. The third piezoelectric substrate 31 is a substrate made of a piezoelectric material. As the piezoelectric material for the third piezoelectric substrate 31, a piezoelectric material, such as $LiTaO_3$, $LiNbO_3$, or quartz crystal, for example, is preferably used as appropriate.

The third IDT electrode 32 faces a third principal surface 311 of the third piezoelectric substrate 31 in the first direction D1 that is a thickness direction of the third piezoelectric substrate 31. In the example of FIG. 1A, the third IDT electrode 32 is provided on the third principal surface 311 of the third piezoelectric substrate 31.

The third IDT electrode 32 includes a plurality of electrode fingers 321 and two busbars (not illustrated). The plurality of electrode fingers 321 are disposed side by side in the second direction D2. The two busbars have a substantially elongated shape with the second direction D2 as its longitudinal direction and are electrically connected to the plurality of electrode fingers 321.

The fourth acoustic wave filter 4 includes a fourth piezoelectric substrate 41 (fourth support member) and a fourth IDT electrode 42 (fourth functional electrode).

The fourth piezoelectric substrate 41 supports the fourth IDT electrode 42. The fourth piezoelectric substrate 41 is a substrate made of a piezoelectric material. As the piezoelectric material for the fourth piezoelectric substrate 41, a piezoelectric material, such as $LiTaO_3$, $LiNbO_3$, or quartz crystal, for example, is preferably used as appropriate.

The fourth IDT electrode 42 faces a fourth principal surface 411 of the fourth piezoelectric substrate 41 in the first direction D1 that is a thickness direction of the fourth piezoelectric substrate 41. In the example of FIG. 1A, the fourth IDT electrode 42 is provided on the fourth principal surface 411 of the fourth piezoelectric substrate 41.

The fourth IDT electrode 42 includes a plurality of electrode fingers 421 and two busbars (not illustrated). The plurality of electrode fingers 421 are disposed side by side in the second direction D2. The two busbars have a substantially elongated shape with the second direction D2 as its longitudinal direction and are electrically connected to the plurality of electrode fingers 421.

The spacer layer 5 is provided on the first principal surface 111 side of the first piezoelectric substrate 11. More specifically, the spacer layer 5 is provided on a first wiring member 81, a second wiring member 82, and a side wall resin 91. The spacer layer 5 has a substantially frame outer peripheral shape and surrounds the first IDT electrode 12 and the third IDT electrode 32 in plan view in the first direction D1 that is the thickness direction of each of the first piezoelectric substrate 11 and the third piezoelectric substrate 31. The spacer layer 5 also surrounds the second IDT electrode 22 and the fourth IDT electrode 42 in plan view in the first direction D1. The spacer layer 5 includes a through hole 51 that exposes the first IDT electrode 12, the second IDT electrode 22, the third IDT electrode 32, and the fourth IDT electrode 42.

The spacer layer 5 has electrical insulation properties. For example, the material for the spacer layer 5 is preferably a synthetic resin, such as an epoxy resin or a polyimide resin.

The plurality of external connection electrodes 6 include a first electrode 61, a second electrode 62, and a third electrode 63. The first electrode 61 and the second electrode 62 are hot electrodes (signal terminals) and the third electrode 63 is a ground electrode (ground terminal). The plurality of external connection electrodes 6 correspond to the plurality of wiring members 8 on a one-to-one basis and are provided on the corresponding wiring members 8 so as to be exposed to the outside. For example, the plurality of external connection electrodes 6 are preferably made of an appropriate metal material such as Cu, Ni, Au, solder, or an alloy including any one of those metals as a main component.

The first electrode 61 and the second electrode 62 are a pair of signal terminals to input and output signals that pass through the first to fourth acoustic wave filters 1 to 4.

The switch 7 is provided between each of the first piezoelectric substrate 11 and the third piezoelectric substrate 31 and each of the plurality of external connection electrodes 6. The switch 7 is preferably a semiconductor switch made of a semiconductor material including silicon, for example, as a main component.

Figure 2:
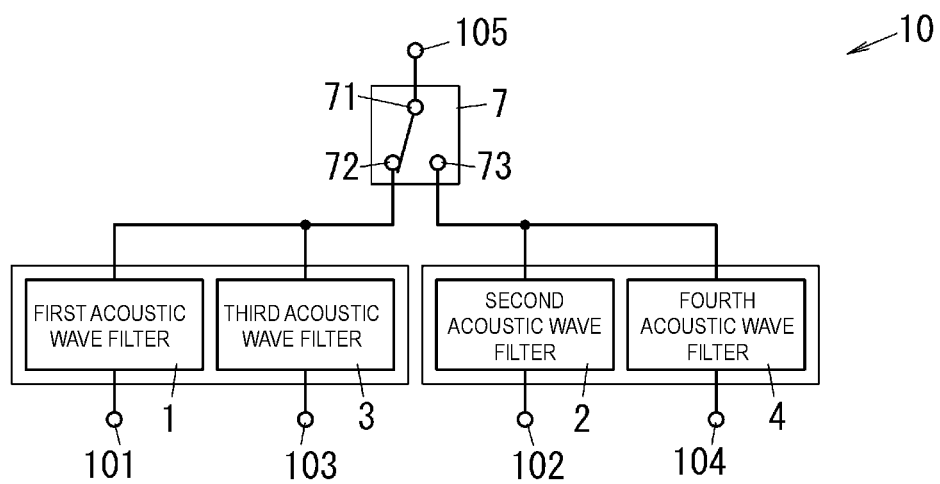
FIG. 2 is a block diagram of the composite electronic component.

As illustrated in FIG. 2, the switch 7 includes a common terminal 71 and a plurality of (two in the illustrated example) selective terminals 72 and 73. The common terminal 71 is electrically connected to a terminal 105 connected to an antenna 300 (see FIG. 4). The first acoustic wave filter 1 and the third acoustic wave filter 3 are electrically connected to the selective terminal 72. The second acoustic wave filter 2 and the fourth acoustic wave filter 4 are electrically connected to the selective terminal 73. The switch 7 switches a selective terminal to be electrically connected to the common terminal 71 between the plurality of selective terminals 72 and 73. That is, when the selective terminal 72 is electrically connected to the common terminal 71, the switch 7 electrically disconnects the selective terminal 73 from the common terminal 71. When the selective terminal 73 is electrically connected to the common terminal 71, the switch 7 electrically disconnects the selective terminal 72 from the common terminal 71.

As illustrated in FIG. 1A, the plurality of wiring members 8 include the first wiring member 81, the second wiring member 82, and a third wiring member 83. The plurality of wiring members 8 electrically connect the first acoustic wave filter 1, the second acoustic wave filter 2, the third acoustic wave filter 3, and the fourth acoustic wave filter 4 to the plurality of external connection electrodes 6.

The material for each wiring member 8 is preferably an appropriate metal material such as Al, Cu, Pt, Au, Ag, Ti, Ni, Cr, Mo, W, or an alloy containing any one of those metals as a main component. Each wiring member 8 may have a structure in which a plurality of metal films formed of those metals or alloys are laminated.

The first wiring member 81 includes a signal line 811 connected to the first electrode 61. The second wiring member 82 includes a signal line 821 connected to the second electrode 62. The third wiring member 83 includes a reference potential line (ground line) 831 having a reference potential (ground).

If input/output terminals of the plurality of acoustic wave filters 1 to 4 are integrated, ISO, IMD, and other factors among the acoustic wave filters need to be taken into consideration. If an input/output terminal is provided for each acoustic wave filter, the number of terminals and the number of wires increase, thus increasing the area.

In view of this, the third wiring member 83 is provided between the first electrode 61 and the second electrode 62 and between the signal line 811 and the signal line 821 in the second direction D2. The distance between the signal line 811 and the signal line 821 is preferably, for example, about 90 μm or more and about 350 μm or less and the width of the reference potential line is preferably, for example, about 50 μm or more and about 150 μm or less.

Thus, in the pair of signal lines 811 and 821, influence from one signal line to the other signal line is able to be reduced or prevented by the reference potential line 831. That is, interference between the first electrode 61 and the second electrode 62 and interference between the signal line 811 and the signal line 821 is able to be reduced or prevented.

The resin member 9 includes the side wall resin 91, a shell resin 92, and a protective resin 93. The side wall resin 91 surrounds the first piezoelectric substrate 11 and the third piezoelectric substrate 31 in plan view in the first direction D1. The shell resin 92 surrounds the second piezoelectric substrate 21 and the fourth piezoelectric substrate 41 in plan view in the first direction D1 and is also provided on principal surfaces 212 and 412 opposite to the second principal surface 211 of the second piezoelectric substrate 21 and the fourth principal surface 411 of the fourth piezoelectric substrate 41. The protective resin 93 covers the switch 7 and the plurality of wiring members 8 around the plurality of external connection electrodes 6.

The resin member 9 has electrical insulation properties. For example, the material for the resin member 9 is preferably a synthetic resin, such as an epoxy resin or a polyimide resin, for example. The resin member 9 may be made of a single material or a plurality of materials. The resin member 9 may be made of an appropriate insulating material other than the resins described above.

First, the first piezoelectric substrate 11 and the third piezoelectric substrate 31 integrated with each other are prepared. Further, the second piezoelectric substrate 21 and the fourth piezoelectric substrate 41 integrated with each other are prepared.

Next, the first IDT electrode 12 and a first wiring layer 13 are formed on the first piezoelectric substrate 11 and the third IDT electrode 32 and a third wiring layer 33 are formed on the third piezoelectric substrate 31. Similarly, the second IDT electrode 22 and a second wiring layer 23 are formed on the second piezoelectric substrate 21 and the fourth IDT electrode 42 and a fourth wiring layer 43 are formed on the fourth piezoelectric substrate 41.

Then, the first wiring member 81, the second wiring member 82, and the third wiring member 83 are formed and the side wall resin 91 is formed.

Then, the first piezoelectric substrate 11 and the third piezoelectric substrate 31 are bonded to the second piezoelectric substrate 21 and the fourth piezoelectric substrate 41 using the spacer layer 5 so that the first IDT electrode 12 and the second IDT electrode 22 face each other and the third IDT electrode 32 and the fourth IDT electrode 42 face each other. A hollow space S1 is formed by the first piezoelectric substrate 11, the second piezoelectric substrate 21, the third piezoelectric substrate 31, the fourth piezoelectric substrate 41, and the spacer layer 5. Pressure bonding, ultrasonic bonding, interatomic bonding, or an adhesive may be used for the bonding.

Then, the shell resin 92 and the protective resin 93 are formed.

Next, an operation of the composite electronic component 10 according to the first preferred embodiment is described with reference to FIG. 2, FIGS. 3A and 3B.

The composite electronic component 10 has electrical connections as illustrated in FIG. 2. More specifically, a parallel circuit of the first acoustic wave filter 1 and the third acoustic wave filter 3 is electrically connected to the selective terminal 72 of the switch 7. A parallel circuit of the second acoustic wave filter 2 and the fourth acoustic wave filter 4 is electrically connected to the selective terminal 73 of the switch 7. A terminal 101 to which an external circuit (not illustrated) is connected is connected to the first acoustic wave filter 1. Similarly, a terminal 102 to which an external circuit is connected is connected to the second acoustic wave filter 2, a terminal 103 to which an external circuit is connected is connected to the third acoustic wave filter 3, and a terminal 104 to which an external circuit is connected is connected to the fourth acoustic wave filter 4. The terminal 105 to which the antenna 300 (see FIG. 4) is connected is connected to the common terminal 71 of the switch 7. The external circuits connected to the terminals 101 to 104 are circuits that are different from each other.

Figure 3A:
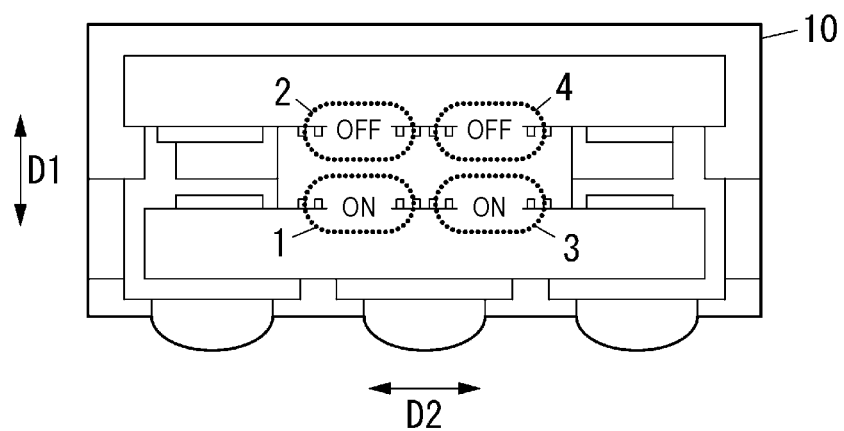
FIG. 3A is a schematic diagram of a first conductive state in the composite electronic component.
Figure 3B:
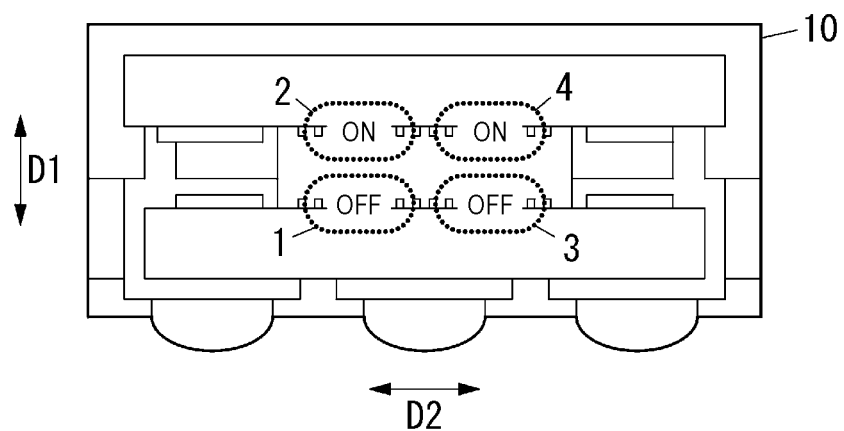
FIG. 3B is a schematic diagram of a second conductive state in the composite electronic component.

In the composite electronic component 10 according to the first preferred embodiment, the conduction state of the first to fourth acoustic wave filters 1 to 4 is switched between a first state illustrated in FIG. 3A and a second state illustrated in FIG. 3B under control of the switch 7.

In the first state, the common terminal 71 and the selective terminal 72 are electrically connected to each other and the common terminal 71 and the selective terminal 73 are electrically disconnected from each other. Thus, in the first state, the first acoustic wave filter 1 and the third acoustic wave filter 3 are in ON states and the second acoustic wave filter that faces the first acoustic wave filter 1 in the first direction D1 and the fourth acoustic wave filter 4 that faces the third acoustic wave filter 3 in the first direction D1 are in OFF states. That is, two acoustic wave filters adjacent to each other in the second direction D2 are in the same state. The "ON state" refers to a state in which a signal is able to pass through the acoustic wave filter. The "OFF state" refers to a state in which a signal is not able to pass through the acoustic wave filter.

In the second state, the common terminal 71 and the selective terminal 73 are electrically connected to each other and the common terminal 71 and the selective terminal 72 are electrically disconnected from each other. Thus, in the second state, the first acoustic wave filter 1 and the third acoustic wave filter 3 are in OFF states and the second acoustic wave filter that faces the first acoustic wave filter 1 in the first direction D1 and the fourth acoustic wave filter 4 that faces the third acoustic wave filter 3 in the first direction D1 are in ON states. That is, two acoustic wave filters adjacent to each other in the second direction D2 are in the same state.

In the composite electronic component 10 described above, the IDT electrodes that face each other are coupled to each other in terms of capacitances and magnetic fields. The intensity of the coupling depends on the areas of the IDT electrodes that face each other and the distance therebetween. Therefore, the switch 7 performs switching control so that only one of the two acoustic wave filters that face each other is brought into an ON state, thus being capable of reducing the influence of the coupling described above. As illustrated in FIGS. 3A and 3B, the composite electronic component 10 according to the first preferred embodiment brings only one of the first acoustic wave filter 1 and the second acoustic wave filter 2 and only one of the third acoustic wave filter 3 and the fourth acoustic wave filter 4 into the ON states. Thus, the capacitive and magnetic coupling between the first acoustic wave filter 1 and the second acoustic wave filter 2 is able to be reduced and the distance between the first acoustic wave filter 1 and the second acoustic wave filter 2 in the first direction D1 is able to be reduced. Further, the capacitive and magnetic coupling between the third acoustic wave filter 3 and the fourth acoustic wave filter 4 is able to be reduced and the distance between the third acoustic wave filter 3 and the fourth acoustic wave filter 4 in the first direction D1 is able to be reduced. As a result, the height of the composite electronic component 10 is able to be reduced.

The composite electronic component 10 described above is used in a communication device 100.

Figure 4:
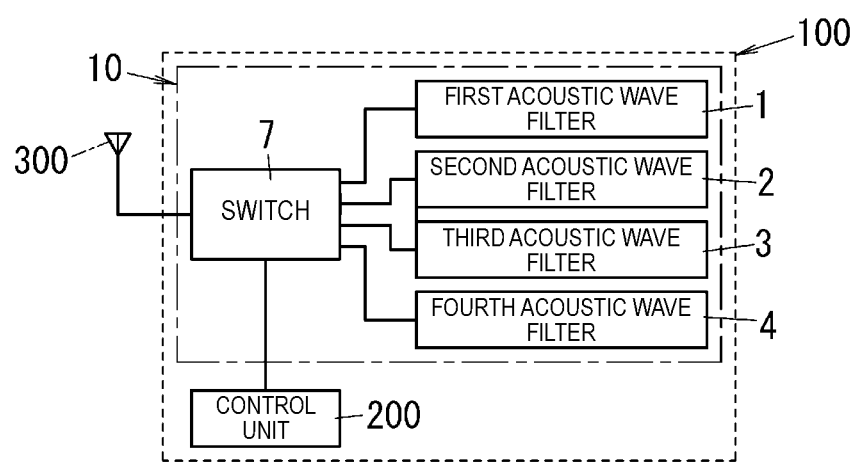
FIG. 4 is a block diagram of a communication device according to the first preferred embodiment of the present invention.

As illustrated in FIG. 4, the communication device 100 includes a control unit 200 and the composite electronic component 10. The first to fourth acoustic wave filters 1 to 4 have communication bands that differ from each other. That is, the communication device 100 is a multiband device.

For example, the control unit 200 is preferably an RFIC and gives an ON/OFF instruction to the switch 7. More specifically, the switch 7 receives, from the control unit 200, instructions related to the ON/OFF state of the first to fourth acoustic wave filters 1 to 4. That is, the switch 7 receives, from the control unit 200, instructions related to which of the first to fourth acoustic wave filters 1 to 4 will be brought into the ON states and which of the first to fourth acoustic wave filters 1 to 4 will be brought into the OFF states.

Based on the instructions from the control unit 200, the switch 7 switches the ON/OFF state of the first to fourth acoustic wave filters 1 to 4. More specifically, the switch 7 selectively switches the ON/OFF state of the first to fourth acoustic wave filters 1 to 4 between the first state illustrated in FIG. 3A and the second state illustrated in FIG. 3B. Through the operation described above, two of the first to fourth acoustic wave filters 1 to 4 are able to be electrically connected to the antenna 300.

As described above, in the composite electronic component 10 according to the first preferred embodiment, the first IDT electrode 12 of the first acoustic wave filter 1 and the second IDT electrode 22 of the second acoustic wave filter 2 face each other with the hollow space S1 interposed therebetween. In this structure, one of the first acoustic wave filter 1 and the second acoustic wave filter 2 that face each other is brought into the OFF state by the switch 7, thus reducing the capacitive and magnetic coupling between the first acoustic wave filter 1 and the second acoustic wave filter 2 that face each other. Thus, interference between the first acoustic wave filter 1 and the second acoustic wave filter 2 is able to be reduced or prevented.

In the composite electronic component 10 according to the first preferred embodiment, the switch 7 exclusively switches the ON states and the OFF states of the first acoustic wave filter and the second acoustic wave filter 2. Thus, the coupling between the first acoustic wave filter 1 and the second acoustic wave filter 2 is able to be further reduced. Similarly, the switch 7 exclusively switches the ON states and the OFF states of the third acoustic wave filter 3 and the fourth acoustic wave filter 4. Thus, the coupling between the third acoustic wave filter 3 and the fourth acoustic wave filter 4 is able to be further reduced.

In the composite electronic component 10 according to the first preferred embodiment, the switch 7 is mounted in a multilayer electronic component including the first to fourth acoustic wave filters 1 to 4. Thus, the overall width is able to be reduced and, therefore, the size is able to be reduced compared with a case in which the switch 7 is provided outside the multilayer electronic component.

In the composite electronic component 10 according to the first preferred embodiment, the switch 7 is provided between the first acoustic wave filter 1 and the external connection electrodes 6. Thus, the distance between the first functional electrode (first IDT electrode 12) and the switch 7 and the distance between the switch 7 and the external connection electrodes 6 is able to be reduced.

In the composite electronic component 10 according to the first preferred embodiment, the reference potential line 831 having the reference potential is provided between the first electrode 61 and the second electrode 62 to input and output signals and between the pair of signal lines 811 and 821. Thus, the interference between the pair of signal terminals and the interference between the pair of signal lines 811 and 821 are able to be reduced.

Modified examples of the first preferred embodiment are described below.

The composite electronic component 10 is not limited to the structure in which the switch 7 is mounted in the multilayer electronic component. The composite electronic component 10 may have a structure in which the switch 7 is provided separately from the multilayer electronic component.

The composite electronic component 10 need not include the four acoustic wave filters (first to fourth acoustic wave filters 1 to 4) but may include two acoustic wave filters, for example.

The switch 7 may include switching portions that are provided for the respective acoustic wave filters. For example, the switch 7 includes a first switching portion corresponding to the first acoustic wave filter 1, a second switching portion corresponding to the second acoustic wave filter 2, a third switching portion corresponding to the third acoustic wave filter 3, and a fourth switching portion corresponding to the fourth acoustic wave filter 4. The first to fourth switching portions operate independently of each other. When the first switching portion and the third switching portion are in ON states, the switch 7 operates so that the second switching portion and the fourth switching portion are brought into OFF states. When the second switching portion and the fourth switching portion are in ON states, the switch 7 operates so that the first switching portion and the third switching portion are brought into OFF states.

The composite electronic component 10 according to the modified examples described above has advantages the same as or similar to those of the composite electronic component 10 according to the first preferred embodiment.

Second Preferred Embodiment

Figure 5:
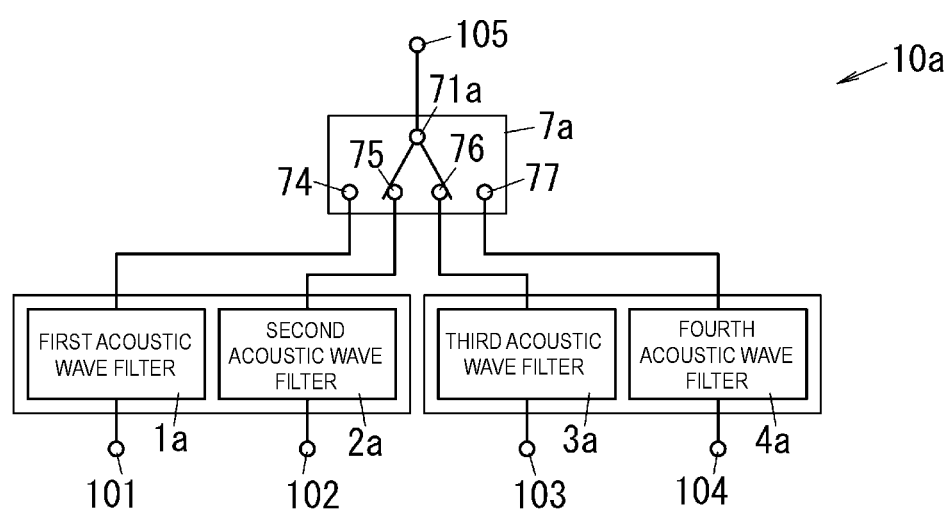
FIG. 5 is a block diagram of a composite electronic component according to a second preferred embodiment of the present invention.

A composite electronic component 10a according to a second preferred embodiment of the present invention is different from the composite electronic component 10 according to the first preferred embodiment (see FIG. 2) in that the composite electronic component 10a has electrical connections as illustrated in FIG. 5. In the composite electronic component 10a according to the second preferred embodiment, elements the same as or similar to those of the composite electronic component 10 according to the first preferred embodiment are represented by the same reference symbols and description thereof is omitted.

The composite electronic component 10a according to the second preferred embodiment includes a first acoustic wave filter 1a, a second acoustic wave filter 2a, a third acoustic wave filter 3a, a fourth acoustic wave filter 4a, and a switch 7a. Similarly to the first preferred embodiment, the composite electronic component 10a further includes the spacer layer 5 (see FIG. 1A), the plurality of external connection electrodes 6 (see FIG. 1A), the plurality of wiring members 8 (see FIG. 1A), and the resin member 9 (see FIG. 1A).

The first acoustic wave filter 1a has a structure that is the same as or similar to that of the first acoustic wave filter 1 of the first preferred embodiment. The second acoustic wave filter 2a has a structure the same as or similar to that of the second acoustic wave filter 2 of the first preferred embodiment. The first acoustic wave filter 1a and the second acoustic wave filter 2a are electrically connected to different selective terminals of the switch 7a.

The third acoustic wave filter 3a has a structure that is the same as or similar to that of the third acoustic wave filter 3 of the first preferred embodiment. The fourth acoustic wave filter 4a has a structure that is the same as or similar to that of the fourth acoustic wave filter 4 of the first preferred embodiment. The third acoustic wave filter 3a and the fourth acoustic wave filter 4a are electrically connected to different selective terminals of the switch 7a.

As illustrated in FIG. 5, the switch 7a includes a common terminal 71a and a plurality of selective terminals 74 to 77. The common terminal 71a is electrically connected to the terminal 105 connected to the antenna 300 (see FIG. 4). The first acoustic wave filter 1a is electrically connected to the selective terminal 74. The second acoustic wave filter 2a is electrically connected to the selective terminal 75. The third acoustic wave filter 3a is electrically connected to the selective terminal 76. The fourth acoustic wave filter 4a is electrically connected to the selective terminal 77.

The switch 7a selects one selective terminal to be electrically connected to the common terminal 71a from the selective terminals 74 and 75 and another selective terminal to be electrically connected to the common terminal 71a from the selective terminals 76 and 77. The switch 7a operates so that the selective terminal 74 and the selective terminal 76 are electrically connected to the common terminal 71a simultaneously. At this time, the switch 7a operates so that the selective terminal 75 and the selective terminal 77 are electrically disconnected from the common terminal 71a. The switch 7a also operates so that the selective terminal 75 and the selective terminal 77 are electrically connected to the common terminal 71a simultaneously. At this time, the switch 7a operates so that the selective terminal and the selective terminal 76 are electrically disconnected from the common terminal 71a.

Next, an operation of the composite electronic component 10a according to the second preferred embodiment is described with reference to FIGS. 6A and 6B.

Figure 6A:
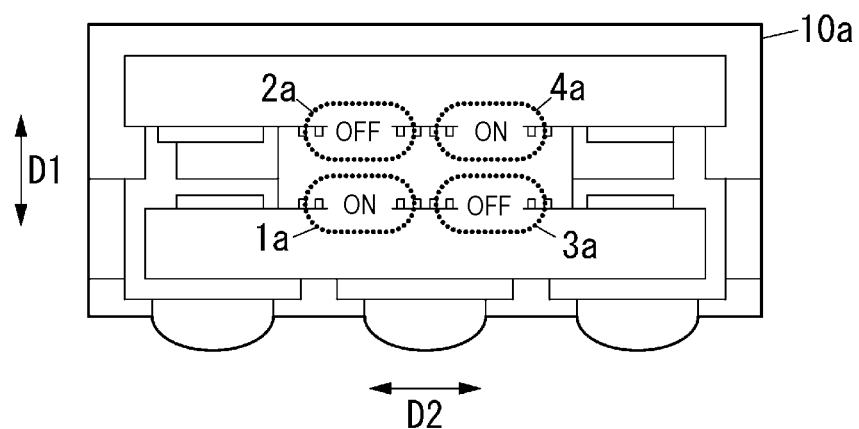
FIG. 6A is a schematic diagram of a first conductive state in a composite electronic component according to a preferred embodiment of the present invention.
Figure 6B:
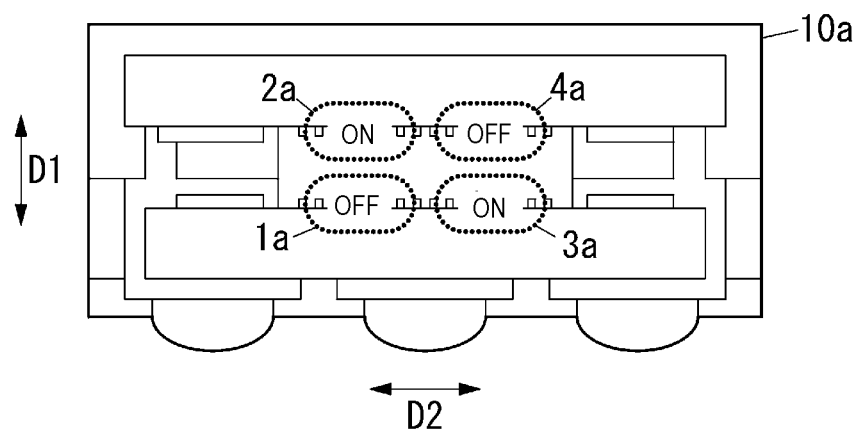
FIG. 6B is a schematic diagram of a second conductive state in a composite electronic component according to a preferred embodiment of the present invention.

In the composite electronic component 10a according to the second preferred embodiment, the ON/OFF state of the first to fourth acoustic wave filters 1a to 4a is switched between a first state illustrated in FIG. 6A and a second state illustrated in FIG. 6B under control of the switch 7a.

In the first state, the common terminal 71a and the selective terminals 74 and 77 are electrically connected to each other and the common terminal 71a and the selective terminals 75 and 76 are electrically disconnected from each other. Thus, in the first state, the first acoustic wave filter 1a and the fourth acoustic wave filter 4a are in ON states and the second acoustic wave filter 2a that faces the first acoustic wave filter 1a in the first direction D1 and the third acoustic wave filter 3a that faces the fourth acoustic wave filter 4a in the first direction D1 are in OFF states. In the first state, one of two acoustic wave filters adjacent to each other in the second direction D2 is in an ON state and the other is in an OFF state. Similarly to the first preferred embodiment, the "ON state" refers to a state in which a signal is able to pass through the acoustic wave filter. The "OFF state" refers to a state in which a signal is not able to pass through the acoustic wave filter.

In the second state, the common terminal 71a and the selective terminals 75 and 76 are electrically connected to each other and the common terminal 71a and the selective terminals 74 and 77 are electrically disconnected from each other. Thus, in the second state, the first acoustic wave filter 1a and the fourth acoustic wave filter 4a are in OFF states and the second acoustic wave filter 2a that faces the first acoustic wave filter 1a in the first direction D1 and the third acoustic wave filter 3a that faces the fourth acoustic wave filter 4a in the first direction D1 are in ON states. In the second state, one of two acoustic wave filters adjacent to each other in the second direction D2 is in an ON state and the other is in an OFF state similarly to the first state.

As described above, in the composite electronic component 10a according to the second preferred embodiment, both of the acoustic wave filters that face each other are not in the ON states and both of the adjacent acoustic wave filters are not in the ON states, thus being capable of further reducing the capacitive and magnetic coupling among the first to fourth acoustic wave filters 1a to 4a. Thus, the interference among the first to fourth acoustic wave filters 1a to 4a is able to further be reduced or prevented.

As a modified example of the second preferred embodiment, the composite electronic component 10a is not limited to the structure in which the switch 7a is mounted in the multilayer electronic component similarly to the first preferred embodiment. The composite electronic component 10a may have a structure in which the switch 7a is provided separately from the multilayer electronic component.

The composite electronic component 10a according to the modified example has advantages the same as or similar to those of the composite electronic component 10a according to the second preferred embodiment.

The preferred embodiments and the modified examples described above are merely a portion of various preferred embodiments and modified examples of the present invention. Various changes may be made to the preferred embodiments and the modified examples depending on design or other factors as long as the advantages of the present invention are achieved.

The following aspects are disclosed based on the preferred embodiments and the modified examples described above.

A composite electronic component (10; 10a) according to a preferred embodiment of the present invention includes the first acoustic wave filter (1; 1a), the second acoustic wave filter (2; 2a), the spacer layer (5), and the switch (7; 7a). The second acoustic wave filter (2; 2a) faces the first acoustic wave filter (1; 1a) in the first direction (D1). The spacer layer (5) has a substantially frame shape and is provided between the first acoustic wave filter (1; 1a) and the second acoustic wave filter (2; 2a) in the first direction (D1). The switch (7; 7a) switches the ON state and the OFF state of the first acoustic wave filter (1; 1a) and the ON state and the OFF state of the second acoustic wave filter (2; 2a). The first acoustic wave filter (1; 1a) includes the first support member (first piezoelectric substrate 11) and the first functional electrode (first IDT electrode 12). The first support member has piezoelectricity at least in a portion thereof. The first functional electrode is provided at the first principal surface (111) of the first support member. The second acoustic wave filter (2; 2a) includes the second support member (second piezoelectric substrate 21) and the second functional electrode (second IDT electrode 22). The second support member has piezoelectricity at least in a portion thereof. The second functional electrode is provided at the second principal surface (211) of the second support member. The hollow space (S1) is defined by the first support member, the second support member, and the spacer layer (5). The first functional electrode and the second functional electrode are located in the hollow space (S1) and face each other in the first direction (D1). The switch (7; 7a) brings at least one of the first acoustic wave filter (1; 1a) and the second acoustic wave filter (2; 2a) into the OFF state.

In a composite electronic component (10; 10a) according to a preferred embodiment of the present invention, one of the first acoustic wave filter (1; 1a) and the second acoustic wave filter (2; 2a) that face each other is brought into the OFF state by the switch (7; 7a), thus being capable of reducing the capacitive and magnetic coupling between the first acoustic wave filter (1; 1a) and the second acoustic wave filter (2; 2a) that face each other. Thus, the interference between the first acoustic wave filter (1; 1a) and the second acoustic wave filter (2; 2a) is able to be reduced or prevented.

In a composite electronic component (10; 10a) according to a preferred embodiment of the present invention, the switch (7; 7a) exclusively switches the ON states and the OFF states of the first acoustic wave filter (1; 1a) and the second acoustic wave filter (2; 2a) in the first aspect.

In a composite electronic component (10; 10a) according to a preferred embodiment of the present invention, the coupling between the first acoustic wave filter (1; 1a) and the second acoustic wave filter (2; 2a) is able to be further reduced.

A composite electronic component (10a) according to a preferred embodiment of the present invention includes the third acoustic wave filter (3a) and the fourth acoustic wave filter (4a). The fourth acoustic wave filter (4a) faces the third acoustic wave filter (3a) in the first direction (D1). The third acoustic wave filter (3a) includes the third support member (third piezoelectric substrate 31) and the third functional electrode (third IDT electrode 32). The third support member has piezoelectricity at least in a portion thereof. The third functional electrode is provided at the third principal surface (311) of the third support member. The fourth acoustic wave filter (4a) includes the fourth support member (fourth piezoelectric substrate 41) and the fourth functional electrode (fourth IDT electrode 42). The fourth support member has piezoelectricity at least in a portion thereof. The fourth functional electrode is provided at the fourth principal surface (411) of the fourth support member. The third functional electrode and the fourth functional electrode are located in the hollow space (S1) and face each other in the first direction (D1). The switch (7a) simultaneously and exclusively switches the ON states and the OFF states of a first group including the first acoustic wave filter (1a) and the fourth acoustic wave filter (4a) and a second group including the second acoustic wave filter (2a) and the third acoustic wave filter (3a).

In a composite electronic component (10a) according to a preferred embodiment of the present invention, both of the acoustic wave filters that face each other are not in the ON states and both of the adjacent acoustic wave filters are not in the ON states, thus being capable of further reducing the capacitive and magnetic coupling among the first to fourth acoustic wave filters (1a to 4a). Thus, the interference among the first to fourth acoustic wave filters (1a to 4a) is able to be further reduced or prevented.

In a composite electronic component (10; 10a) according to a preferred embodiment of the present invention, the first acoustic wave filter (1; 1a) and the second acoustic wave filter (2; 2a) define a multilayer electronic component. The switch (7; 7a) is mounted in the multilayer electronic component.

In a composite electronic component (10; 10a) according to a preferred embodiment of the present invention, the overall width is able to be reduced and, therefore, the size is able to be reduced compared with the case in which the switch (7; 7*a*) is provided outside the multilayer electronic component.

In a composite electronic component (10; 10*a*) according to a preferred embodiment of the present invention, a multilayer electronic component includes the external connection electrode (6) described. The switch (7; 7*a*) is provided between the first acoustic wave filter (1; 1*a*) and the external connection electrode (6).

In a composite electronic component (10; 10*a*) according to a preferred embodiment of the present invention, the distance between the first functional electrode (first IDT electrode 12) and the switch (7; 7*a*) and the distance between the switch (7; 7*a*) and the external connection electrode (6) is able to be reduced.

In a composite electronic component (10; 10*a*) according to a preferred embodiment of the present invention, the switch (7; 7*a*) overlaps the first functional electrode (first IDT electrode 12) in plan view in the first direction (D1).

A composite electronic component (10; 10*a*) according to a preferred embodiment of the present invention further includes the pair of signal terminals (first electrode 61 and second electrode 62), the pair of signal lines (811, 821), and the reference potential line (831) in any one of the first to sixth aspects. The pair of signal terminals are used to input and output signals that pass through at least the first acoustic wave filter (1; 1*a*) and the second acoustic wave filter (2; 2*a*). The pair of signal lines (811, 821) are connected to the pair of signal terminals. The reference potential line (831) has the reference potential and is provided between the pair of signal terminals and between the pair of signal lines (811, 821).

In a composite electronic component (10; 10*a*) according to a preferred embodiment of the present invention, the reference potential line (831) having the reference potential is provided between the pair of signal terminals (first electrode 61 and second electrode 62) to input and output signals and between the pair of signal lines (811, 821). Thus, the interference between the pair of signal terminals and the interference between the pair of signal lines (811, 821) are able to be reduced.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A composite electronic component, comprising:
    a first acoustic wave filter;
    a second acoustic wave filter that faces the first acoustic wave filter in a first direction;
    a spacer layer having a substantially frame shape and provided between the first acoustic wave filter and the second acoustic wave filter in the first direction; and
    a switch that switches an ON state and an OFF state of the first acoustic wave filter and an ON state and an OFF state of the second acoustic wave filter; wherein
    the first acoustic wave filter includes:
        a first support having piezoelectricity at least in a portion thereof; and
        a first functional electrode provided at a first principal surface of the first support;
    the second acoustic wave filter includes:
        a second support having piezoelectricity at least in a portion thereof; and
        a second functional electrode provided at a second principal surface of the second support;
    a hollow space is defined by the first support, the second support, and the spacer layer;
    the first functional electrode and the second functional electrode are located in the hollow space and face each other in the first direction; and
    the switch brings at least one of the first acoustic wave filter and the second acoustic wave filter into the OFF state.

2. The composite electronic component according to claim 1, wherein the switch exclusively switches the ON states and the OFF states of the first acoustic wave filter and the second acoustic wave filter.

3. The composite electronic component according to claim 2, further comprising:
    a third acoustic wave filter; and
    a fourth acoustic wave filter that faces the third acoustic wave filter in the first direction; wherein
    the third acoustic wave filter includes:
        a third support having piezoelectricity at least in a portion thereof; and
        a third functional electrode provided at a third principal surface of the third support;
    the fourth acoustic wave filter includes:
        a fourth support having piezoelectricity at least in a portion thereof; and
        a fourth functional electrode provided at a fourth principal surface of the fourth member;
    the third functional electrode and the fourth functional electrode are located in the hollow space and face each other in the first direction; and
    the switch simultaneously and exclusively switches ON states and OFF states of a first group including the first acoustic wave filter and the fourth acoustic wave filter and a second group including the second acoustic wave filter and the third acoustic wave filter.

4. The composite electronic component according to claim 1, wherein
    the first acoustic wave filter and the second acoustic wave filter define a multilayer electronic component; and
    the switch is mounted in the multilayer electronic component.

5. The composite electronic component according to claim 4, wherein
    the multilayer electronic component includes an external connection electrode; and
    the switch is provided between the first acoustic wave filter and the external connection electrode.

6. The composite electronic component according to claim 5, wherein the switch overlaps the first functional electrode in plan view in the first direction.

7. The composite electronic component according to a claim 1, further comprising:
    a pair of signal terminals to input and output signals that pass through at least the first acoustic wave filter and the second acoustic wave filter;
    a pair of signal lines connected to the pair of signal terminals; and
    a reference potential line having a reference potential and provided between the pair of signal terminals and between the pair of signal lines.

8. The composite electronic component according to a claim 1, wherein the first and second functional electrodes are interdigital electrodes.

9. The composite electronic component according to a claim 3, wherein the third and fourth functional electrodes are interdigital electrodes.

10. The composite electronic component according to a claim 1, wherein the first and second supports are piezoelectric substrates made of $LiTaO_3$, $LiNbO_3$, or quartz crystal.

11. The composite electronic component according to a claim 3, wherein the third and fourth supports are piezoelectric substrates made of $LiTaO_3$, $LiNbO_3$, or quartz crystal.

12. The composite electronic component according to a claim 1, wherein the spacer layer is made of a synthetic resin.

13. The composite electronic component according to a claim 12, wherein the synthetic resin is an epoxy resin or a polyimide resin.

14. The composite electronic component according to a claim 1, wherein the switch is a semiconductor switch.

15. The composite electronic component according to a claim 14, wherein the semiconductor switch includes silicon as a main component.

16. The composite electronic component according to a claim 3, further comprising:
   a resin body including a sidewall resin, a shell resin, and a protective resin; wherein
   the sidewall resin surrounds the first and third supports;
   the shell resin surrounds the second and fourth supports; and
   the protective resin covers the switch.

* * * * *